US007728575B1

(12) United States Patent
Ozalevli et al.

(10) Patent No.: US 7,728,575 B1
(45) Date of Patent: Jun. 1, 2010

(54) METHODS AND APPARATUS FOR HIGHER-ORDER CORRECTION OF A BANDGAP VOLTAGE REFERENCE

(75) Inventors: Erhan Ozalevli, Dallas, TX (US); Luthuli E. Dake, Mckinney, TX (US); Gregory Romas, Mckinney, TX (US); Gary L. Wakeman, Wylie, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 12/338,679

(22) Filed: Dec. 18, 2008

(51) Int. Cl.
*G05F 3/16* (2006.01)
*H01L 35/00* (2006.01)

(52) U.S. Cl. ........................ 323/313; 323/315; 327/513

(58) Field of Classification Search ......... 323/312–316, 323/907; 327/490, 512, 513, 538–543; 361/93.8, 361/103
See application file for complete search history.

(56) References Cited

U.S. PATENT DOCUMENTS 4,325,018 A * 4/1982 Schade, Jr. .................. 323/313
5,737,170 A * 4/1998 Moyer ........................ 361/103
6,002,244 A * 12/1999 Wrathall ..................... 323/315
6,157,245 A 12/2000 Rincon-Mora
6,815,941 B2 11/2004 Butler
7,253,599 B2 8/2007 Chen et al.

OTHER PUBLICATIONS

A Curvature-Corrected Low-Voltage Bandgap Reference, Gunawan et al., IEEE Journal of Solid-State Circuits, vol. 28, No. 6, Jun. 1993, 4 pages.

A 1.5-V 10-ppm/° C. 2nd-Order Curvature-Compensated CMOS Bandgap Reference with Trimming, Hsiao et al., IEEE, Copyright 2006, 4 pages.

A Precision Reference Voltage Source, Karel E. Kuijk, IEEE Journal of Solid-State Circuits, vol. SC-8, No. 3, Jun. 1973, 5 pages.

Exponential Curvature-Compensated BiCMOS Bandgap References, Lee et al., IEEE Journal of Solid-State Circuits, vol. 29, No. 11, Nov. 1994, 8 pages.

Curvature-Compensated BiCMOS Bandgap with 1-V Supply Voltage, Malcovati et al., IEEE Journal of Solid-State Circuits, vol. 36, No. 7, Jul. 2001, 6 pages.

(Continued)

*Primary Examiner*—Jessica Han
*Assistant Examiner*—Emily Pham
(74) *Attorney, Agent, or Firm*—William B. Kempler; Wade J. Brady, III; Frederick J. Telecky, Jr.

(57) ABSTRACT

Methods and apparatus for higher-order correction of bandgap voltage references are disclosed. An example bandgap voltage reference circuit disclosed herein comprises a bandgap voltage generation circuit comprising a first resistor, the bandgap voltage generation circuit configured to generate a proportional-to-absolute-temperature current to drive the first resistor to produce a first voltage, the first voltage contributing to an output bandgap voltage, and a first correction circuit electrically coupled to the first resistor and configured to provide a first correction current, the first correction circuit comprising a first nonlinear device configured to generate the first correction current only within a first temperature range, the first correction current decreasing with increasing temperature, the first correction current to drive the first resistor to increase the first voltage only within the first temperature range.

20 Claims, 7 Drawing Sheets

OTHER PUBLICATIONS

A New Curvature-Corrected Bandgap Reference, Meijer et al., IEEE Journal of Solid-State Circuits, vol. SC-17, No. 6, Dec. 1982, 5 pages.

A Precision CMOS Bandgap Reference, Michejda et al., IEEE Journal of Solid-State Circuits, vol. SC-19, No. 6, Dec. 1984, 8 pages.

A High Precision CMOS Bandgap Reference, Pan et al., IEEE, Copyright 2007, 4 pages.

A Precision Curvature-Compensated CMOS Bandgap Reference, Song et al., IEEE Journal of Solid-State Circuits, vol. SC-18, No. 6, Dec. 1983, 10 pages.

A Curvature Compensation Technique for Bandgap Voltage References Using Adaptive Reference Temperature, Tiew et al., IEEE, Copyright 2002, 4 pages.

A High Precision CMOS Bandgap Reference with Second-Order Curvature-Compensation, Zhang et al., IEEE, Copyright 2007, 4 pages.

* cited by examiner

METHODS AND APPARATUS FOR HIGHER-ORDER CORRECTION OF A BANDGAP VOLTAGE REFERENCE

FIELD OF THE DISCLOSURE

This disclosure relates generally to bandgap voltage references and, more particularly, to methods and apparatus for higher-order correction of bandgap voltage references.

BACKGROUND

Bandgap voltage references are used in a variety of integrated circuits, electronic devices and electronic systems requiring a stable voltage reference over a range of temperatures and process variations. For example, many data acquisition systems, voltage regulators, measurement equipment, etc., utilize bandgap voltage reference circuits to provide a stable voltage reference to which other supply and/or input voltages can be compared. Although conventional bandgap voltage reference circuits generate bandgap voltages exhibiting little variation in a nominal range of operating temperatures, higher-order device characteristics, such as device voltages and/or currents that vary nonlinearly with temperature, can cause the generated bandgap voltage to vary substantially at higher and lower temperatures outside the nominal temperature range. Some existing bandgap voltage reference circuits attempt to correct for higher-order bandgap voltage variation at higher operating temperatures, but not at lower operating temperatures. Additionally, some existing bandgap voltage reference circuits attempt to correct for higher-order bandgap voltage variation at higher and/or lower operating temperatures, but require trimming at multiple temperatures.

SUMMARY

The methods and apparatus described herein relate generally to bandgap voltage references and, more particularly, to methods and apparatus for higher-order correction of bandgap voltage references. In an example bandgap voltage reference circuit implementation, a first, low temperature correction circuit is configured to provide second-order correction of an output bandgap voltage reference over a particular low temperature range. To perform such second-order correction, the low temperature correction circuit operates to increase a first voltage contributing to an output bandgap voltage reference, but only within the particular low temperature range. The example low temperature correction circuit achieves this voltage increase by generating a low temperature correction current within the particular low temperature range, with the low temperature correction current having a negative temperature coefficient such that it decreases with increasing temperature. This low temperature correction current is applied to a resistor configured to generate the first voltage to increase the first voltage only within the particular low temperature range, with such a voltage increase decreasing with temperature in accordance with the negative temperature coefficient of the first correction current. In this way, the example bandgap voltage reference circuit can compensate for a second-order characteristic of the bandgap voltage reference that occurs within the particular low temperature range.

Other example implementations can include a second, high temperature correction circuit to provide similar second-order correction of the output bandgap voltage reference over a particular high temperature range. Furthermore, additional such correction circuits can be used and configured to provide even higher-order correction of the bandgap voltage reference.

DETAILED DESCRIPTION

Figure 1:
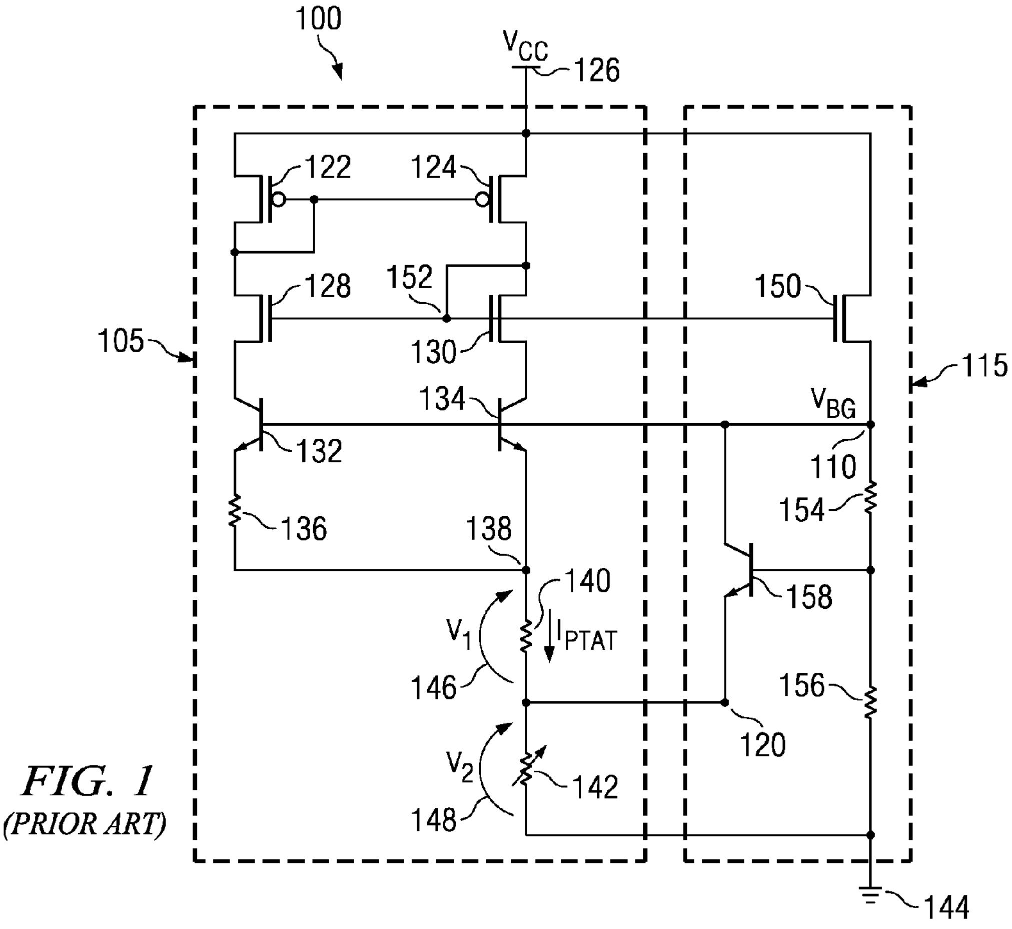
FIG. 1 (PRIOR ART)
FIG. 1 is a schematic diagram of an example prior art bandgap voltage reference circuit.

Methods and apparatus for higher-order correction of bandgap voltage references are described herein. Similar to conventional solutions, the example methods and apparatus described herein operate to perform higher-order correction of bandgap voltage variation at higher operating temperatures of a bandgap voltage reference circuit. However, unlike conventional solutions, the described example methods and apparatus operate to perform higher-order correction of bandgap voltage variation at lower operating temperatures of the bandgap voltage reference circuit, as well. In an example implementation, a bandgap voltage generation circuit provides higher-order correction of a bandgap voltage reference in the form of a first-order correction and a second-order correction. To provide the first-order correction of the bandgap voltage reference, the example bandgap voltage generation circuit is configured to generate a proportional-to-absolute-temperature (PTAT) current that increases with increasing temperature or, in other words, that has a positive temperature coefficient. The PTAT current drives a resistor and produces a first voltage also having a positive temperature coefficient that contributes to a bandgap voltage reference output by the example bandgap voltage reference circuit. A second, base-emitter voltage of a transistor also contributes to the bandgap voltage reference, with the second voltage decreasing as temperature increases or, in other words, having a negative temperature coefficient. Accordingly, the bandgap voltage generation circuit uses the positive temperature coefficient of the first voltage to compensate for the negative temperature coefficient of the second voltage, thereby providing first-order correction of the output bandgap voltage reference over a nominal operating temperature range.

The example bandgap voltage generation circuit also provides second-order correction of the output bandgap voltage reference in the form of a second, nonlinear correction applied at temperatures outside a nominal temperature range. Such second-order correction attempts to compensate for device voltages and/or currents that exhibit second-order nonlinear variation with temperature. Without appropriate correction, such variation could cause the output bandgap voltage reference to vary substantially at higher and lower temperatures outside the nominal temperature range.

To provide second-order correction of the output bandgap voltage reference over lower temperatures, the example bandgap voltage generation circuit also includes an example low temperature correction circuit implemented as described herein to further increase the first voltage contributing to the output bandgap voltage reference, but only within a particular low temperature range. The example low temperature correction circuit achieves this voltage increase by generating a low temperature correction current only within the particular low temperature range. Furthermore, the low temperature correction current has a negative temperature coefficient such that the low temperature correction current decreases with increasing temperature or, equivalently, increases with decreasing temperature. Accordingly, the low temperature correction circuit produces a noticeable correction current only at low temperatures. This low temperature correction current is applied to the resistor generating the first voltage to increase the first voltage within the low temperature range, with the additional voltage decreasing with temperature in accordance with the negative temperature coefficient of the low temperature correction current. Thus, unlike conventional bandgap reference circuit implementation, here a second-order characteristic of the second, base-emitter voltage that is exhibited within the particular low temperature range can be compensated to further correct the bandgap voltage reference.

In an example implementation, the bandgap voltage generation circuit further includes a high temperature correction circuit to provide similar second-order correction of the output bandgap voltage reference over high temperatures. An example high temperature correction circuit implemented as described herein operates to further increase the first voltage contributing to the output bandgap voltage reference, but only within a particular high temperature range. The example high temperature correction circuit achieves this voltage increase by generating a high temperature correction current only within the particular high temperature range. Furthermore, the high temperature correction current has a positive temperature coefficient such that the high temperature correction current increases with increasing temperature or, equivalently, decreases with decreasing temperature. Accordingly, the high temperature correction circuit produces a noticeable correction current only at high temperatures. This high temperature correction current is applied to the resistor generating the first voltage to increase the first voltage within the high temperature range, with the additional voltage increasing with temperature in accordance with the positive temperature coefficient of the particular high temperature correction current. In this way, a second-order characteristic of the second, base-emitter voltage that is exhibited within the particular high temperature range can be compensated to further correct the bandgap voltage reference.

Additional such correction circuits can be used and configured to provide even higher-order correction of the bandgap voltage reference if needed in a particular application. Such higher-order correction can take the form of further nonlinear correction applied at temperatures outside a nominal temperature range. Also, in at least some example implementations, a resistor used to generate the first voltage contributing to the bandgap voltage reference is implemented using a variable resistor to support trimming of the bandgap voltage. Because the low temperature and the high temperature correction currents are both applied to this same variable resistor, all trimming can be performed by the single variable resistor, thereby simplifying and, thus, potentially reducing the cost associated with bandgap voltage reference calibration. Moreover, because the low temperature and the high temperature correction currents are designed to provide additional bandgap voltage correction at low and high temperatures, respectively, trimming can be performed at only a single nominal temperature, such as room temperature. In contrast, conventional bandgap voltage reference circuits often require trimming at multiple temperatures across the circuit's range of operating temperatures. This ability to perform trimming at only one nominal temperature can further simplify bandgap voltage reference calibration in at least some of the bandgap voltage reference circuits implemented according to the methods and apparatus described herein.

Turning to the figures, a schematic diagram of an example prior art bandgap voltage reference circuit 100 is illustrated in FIG. 1. The example prior art bandgap voltage reference circuit 100 includes a bandgap voltage generation circuit 105 configured to generate a bandgap voltage reference at a bandgap voltage output circuit node 110. The example prior art bandgap voltage reference circuit 100 also includes an example high temperature correction circuit 115 configured to provide a high temperature correction current at a correction current input circuit node 120. As described above, the high temperature correction current applied to correction current input circuit node 120 provides high temperature second-order correction of the bandgap voltage reference generated at the bandgap voltage output circuit node 110.

The example bandgap voltage generation circuit 105 of FIG. 1 includes a pair of p-type metal-oxide-semiconductor field-effect transistors (pMOSFETs) 122 and 124 configured to implement a current mirror circuit. In the illustrated example, the sources of the example pMOSFETs 122 and 124 are both electrically coupled to a source Vcc voltage 126. Additionally, the gates of both example pMOSFETs 122 and 124 are electrically coupled together, with the gate and the drain of the example pMOSFET 122 also being coupled together. Such a configuration of the example pMOSFETs 122 and 124 causes a current provided at the drain of the example pMOSFET 122 to be mirrored at the drain of the example pMOSFET 124. In other words, the current provided at the drains of the example pMOSFETs 122 and 124 will be substantially the same.

The example bandgap voltage generation circuit 105 also includes a pair of n-type MOSFETs (nMOSFETs) 128 and 130 configured in cascode with the current mirror circuit implemented by the example pMOSFETs 122 and 124. In the illustrated example, the drain of the example nMOSFET 128 is electrically coupled to the drain of the example pMOSFET 122 and the drain of the example nMOSFET 130 is electrically coupled to the drain of the example pMOSFET 124. Additionally, the gates of both example nMOSFETs 128 and 130 are electrically coupled together, with the gate and the drain of the example nMOSFET 130 also being coupled together. Such a configuration of the example nMOSFETs 128 and 130 further causes a voltage provided at the source of the example nMOSFET 128 to be substantially the same as a voltage provided at the source of the example nMOSFET 130.

To generate a proportional-to-absolute-temperature (PTAT) current for use in generating the bandgap voltage reference at the output circuit node 110, the example bandgap voltage generation circuit 105 further includes a pair of npn bipolar junction transistors (BJTs) 132 and 134 electrically coupled at their emitters via a resistor 136. In the illustrated example, the collector of the example BJT 132 is electrically coupled to the source of the example nMOSFET 128 and the collector of the example BJT 134 is electrically coupled to the source of the example nMOSFET 130, with the emitters of both example BJTs 132 and 134 coupled via the example resistor 136. Additionally, the bases of both example BJTs 132 and 134 are electrically coupled together and form the bandgap voltage output circuit node 110. In the illustrated example, the example BJTs 132 and 134 have different emitter densities, which causes a voltage drop across the example resistor 136 that increases with increasing temperature. This voltage drop across the example resistor 136 produces an associated current having a positive temperature coefficient that is mirrored at the emitters of the example BJTs 132 and 134. These mirrored currents are combined at circuit node 138 to generate the PTAT current as shown in FIG. 1.

To generate the bandgap voltage reference from the PTAT current, the example bandgap voltage generation circuit 105 includes a resistor 140 electrically coupled to the circuit node 138 and a variable resistor 142 electrically coupled to a circuit ground 144 and the circuit node 138 via the resistor 140. In the illustrated example, the PTAT current drives the example resistor 140 and the example variable resistor 142 to produce a first voltage 146 and a second voltage 148, respectively. The first and second voltages 146 and 148 are combined with the base-emitter voltage ($V_{BE}$) of the BJT 134 to generate the bandgap voltage reference at the output circuit node 110.

Generally, the $V_{BE}$ of the BJT 134 has a negative temperature coefficient and, therefore, decreases with increasing temperature. In contrast, the first and second voltages 146 and 148 have positive temperature coefficients corresponding to the positive temperature coefficient of the PTAT current. As such, the first and second voltages 146 and 148 decreases with increasing temperature, providing a first-order compensation of the decreasing $V_{BE}$ of the BJT 134, at least over a nominal operating temperature range.

The example high temperature correction circuit 115 is included in the example prior art bandgap voltage reference circuit 100 to provide second-order correction of the output bandgap voltage reference over high temperatures. In the illustrated example, the example high temperature correction circuit 115 includes an nMOSFET 150 in a source follower configuration. The drain of the example nMOSFET 150 is electrically coupled to Vcc 126, the gate of the example nMOSFET 150 is electrically coupled to the gates of the example nMOSFETs 128 and 130 at a circuit node 152, and the source of the example nMOSFET 150 is electrically coupled to the bandgap voltage reference output circuit node 110. The output circuit node 110 is also coupled to ground 144 via the resistors 154 and 156. The example configuration of the nMOSFET 150 and the resistors 154 and 156 operates to provide a substantially constant bias voltage to the base of a BJT 158 also included in the example high temperature correction circuit 115. In the illustrated example, the collector of the BJT 158 is electrically coupled to the bandgap voltage reference output circuit node 110, the emitter of the BJT 158 is electrically coupled to the correction current input circuit node 120 and the base of the BJT 158 is electrically coupled to the resistors 154 and 156.

The example BJT 158 of the example high temperature correction circuit 115 operates to provide a high temperature correction current to the correction current input circuit node 120 of the example bandgap voltage generation circuit 105. In the illustrated example, the BJT 158 remains off at low temperatures. As temperature increases, the voltage 148 across the example variable resistor 142 increases due to the positive coefficient of the PTAT current driving the variable resistor 142. Accordingly, the voltage at the emitter of the example BJT 158 also increases with temperature, which causes the voltage difference between the base and emitter of the BJT 158 to decrease with increasing temperature. However, the internal $V_{BE}$ of the example BJT 158 has a negative temperature coefficient, which causes the internal $V_{BE}$ characteristic of the BJT 158 to decrease with temperature faster than the decreasing voltage difference between the base and emitter of the BJT 158. As a result, the example BJT 158 will turn on at higher temperatures once the internal $V_{BE}$ characteristic becomes less than the voltage difference between the base and emitter of the BJT 158. Furthermore, after the example BJT 158 turns on, the current provided by the emitter of the BJT 158 will increase with increasing temperature as the internal $V_{BE}$ characteristic decreases faster than the base-emitter voltage difference.

Thus, the emitter of the BJT 158 provides a high temperature correction current only in a particular high temperature range (e.g., as configured by the resistors 154 and 156), with the high temperature correction current having a positive temperature coefficient. This high temperature correction current is applied to the correction current input circuit node 120 and causes the voltage 148 across the example variable resistor 142 to increase only in the particular high temperature range when the high temperature correction current is available. Furthermore, this increase of the voltage 148 in the particular high temperature range has a positive temperature coefficient corresponding to the positive temperature coefficient of the high temperature correction current. In the illustrated example, such an increase in the voltage 148 is able to compensate for a second order decrease in the $V_{BE}$ of the BJT 134 occurring at high temperatures to provide second-order correction of the bandgap voltage reference generated at the output circuit node 110.

Figure 2:
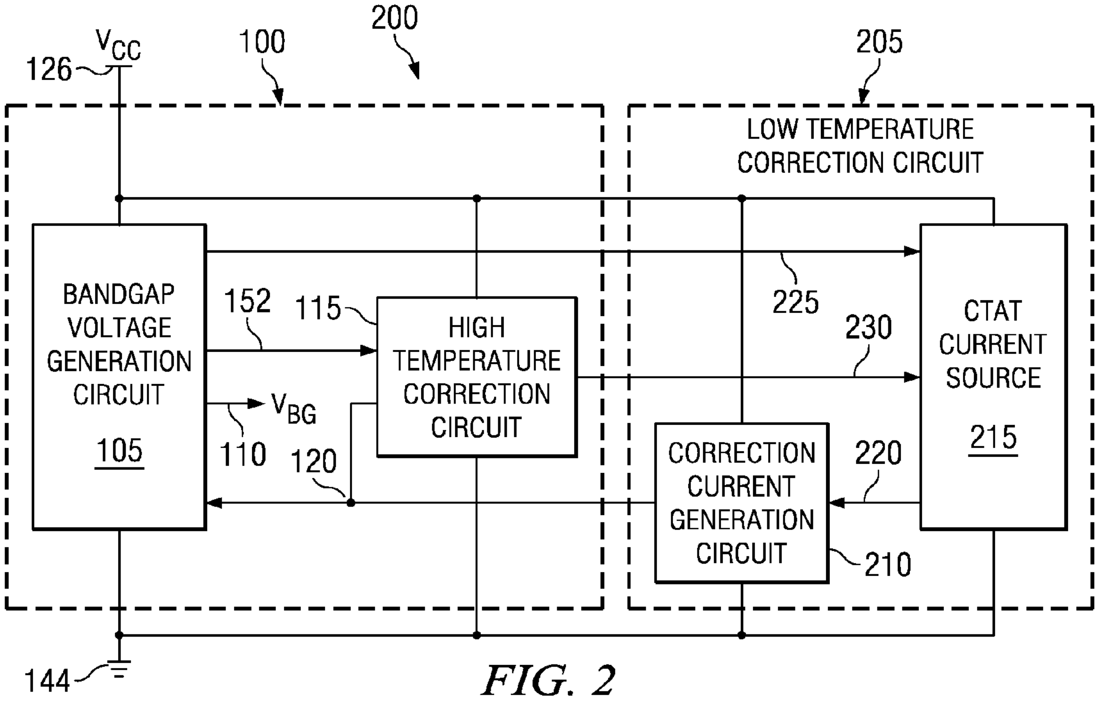
FIG. 2 is a block diagram of an example bandgap voltage reference circuit supporting higher-order bandgap voltage correction according to the methods and apparatus described herein.

A block diagram of an example bandgap voltage reference circuit 200 supporting higher-order bandgap voltage correction according to the methods and apparatus described herein is illustrated in FIG. 2. The example bandgap voltage reference circuit 200 includes elements in common with the example prior-art bandgap voltage reference circuit 100 of FIG. 1. As such, like elements in FIGS. 1 and 2 are labeled with the same reference numerals. The detailed descriptions of these like elements are provided above in connection with the discussion of FIG. 1 and, in the interest of brevity, are not repeated in the discussion of FIG. 2.

Turning to FIG. 2, the example bandgap voltage reference circuit 200 includes the example bandgap voltage reference circuit 100 of FIG. 1. As such, the example bandgap voltage reference circuit 200 includes the example bandgap voltage generation circuit 105 configured to generate the bandgap voltage reference at the bandgap voltage output circuit node 110. The example bandgap voltage reference circuit 200 also includes the example high temperature correction circuit 115 configured to provide the high temperature correction current at the correction current input circuit node 120 as described above in connection with FIG. 1. In the illustrated example of FIG. 2, the implementations of the bandgap voltage generation circuit 105 and the high temperature correction circuit 115 are substantially similar to the example implementations shown in FIG. 1 and described above, with a few exceptions described in greater detail below.

In addition to the high temperature correction circuit 115, the example bandgap voltage reference circuit 200 also includes a low temperature correction circuit 205 configured to provide a low temperature correction current also at the correction current input circuit node 120. Thus, unlike the example prior-art bandgap voltage reference circuit 100, here the bandgap voltage reference circuit 200 provides low temperature, as well as high temperature, second-order correction of the bandgap voltage reference generated at the bandgap voltage output circuit node 110.

The example low temperature correction circuit 205 includes a correction current generation circuit 210 to generate the low temperature correction current to be applied at the correction current input circuit node 120. As discussed above and described in greater detail below, the example correction current generation circuit 210 operates to generate the low temperature correction current only within a particular low temperature range. Furthermore, the low temperature correction current is generated to have a negative temperature coefficient such that the low temperature correction current decreases with increasing temperature or, equivalently, increases with decreasing temperature. Such a low temperature corrected current can be used to compensate for a second order decrease in the bandgap voltage that can occur at low temperatures to provide second-order correction of the bandgap voltage reference generated at the output circuit node 110. An example implementation of the correction current generation circuit 210 is illustrated in FIG. 3 and discussed in greater detail below.

Figure 4:
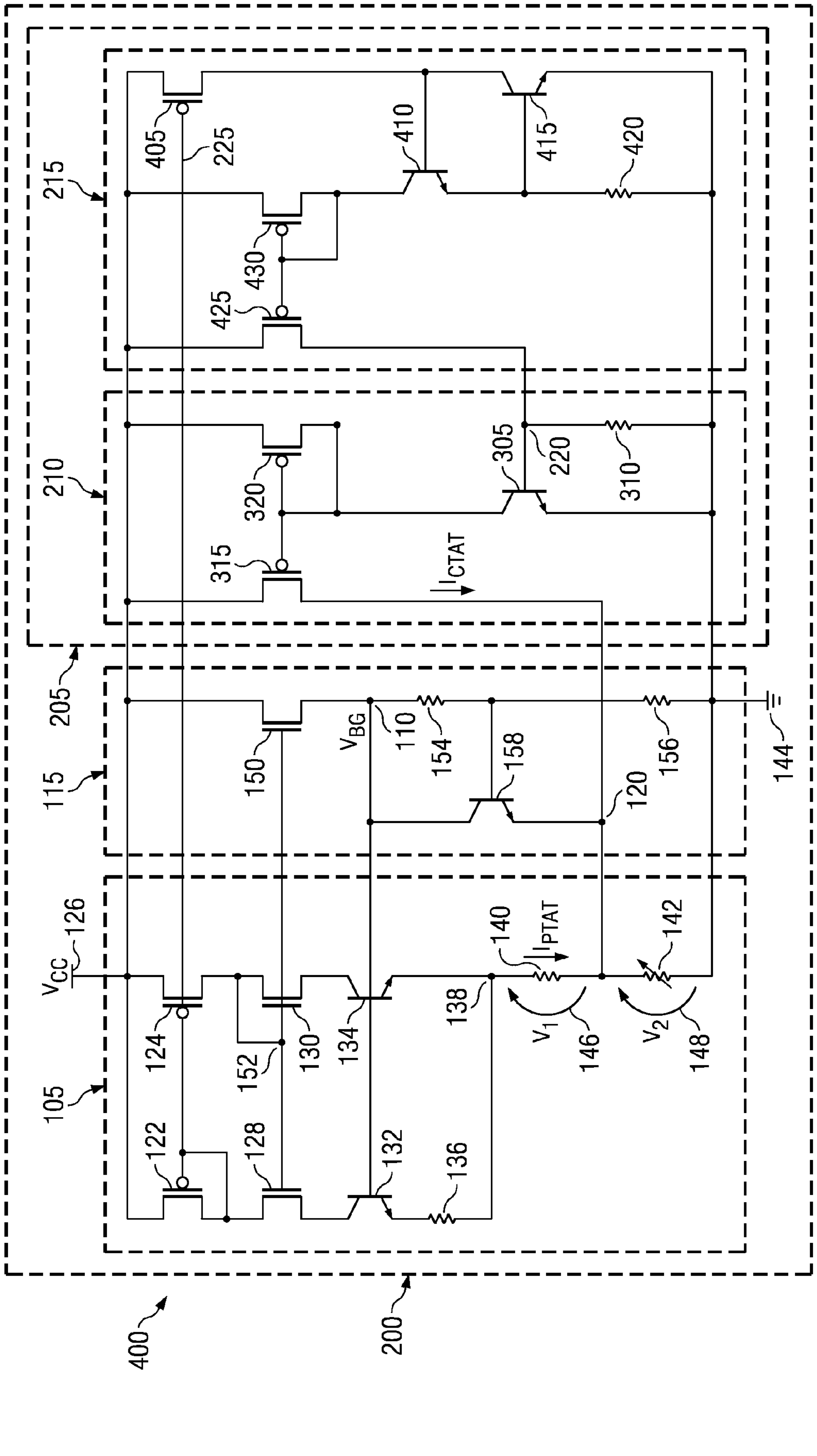
FIG. 4 is a schematic diagram illustrating a first detailed example implementation of the example bandgap voltage reference circuit of FIG. 2.
Figure 5:
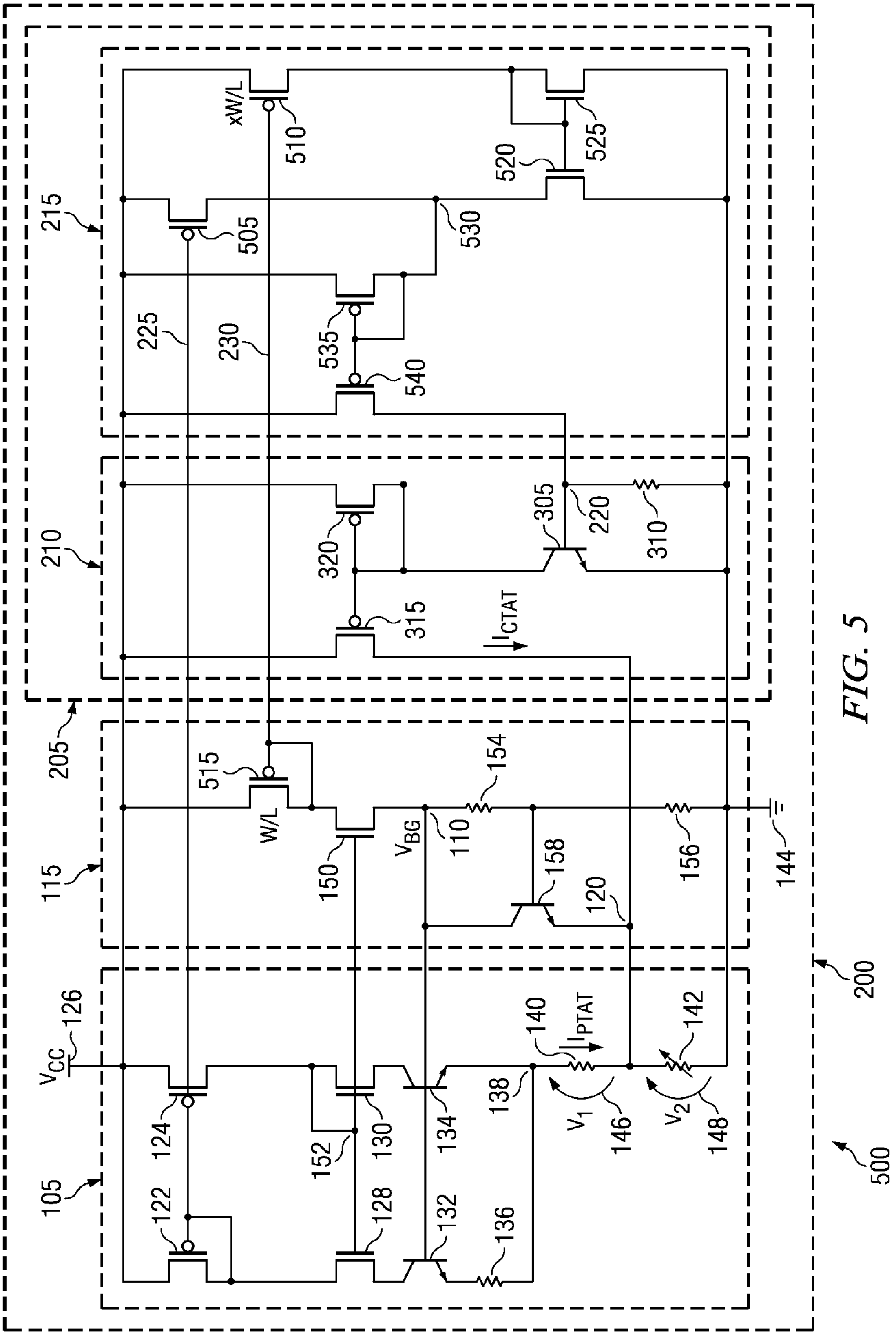
FIG. 5 is a schematic diagram illustrating a second detailed example implementation of the example bandgap voltage reference circuit of FIG. 2.

The example low temperature correction circuit 205 also includes a complementary-to-absolute-temperature (CTAT) current source 215 to generate a CTAT current at a CTAT current circuit node 220 for use by the example correction current generation circuit 210 to generate the low temperature correction current. The CTAT current generated by the example low temperature correction circuit 205 has a negative temperature coefficient and, thus, yields a low temperature correction current also having a negative temperature coefficient. To generate the CTAT current, the example CTAT current source 215 accepts a PTAT-like current related to the PTAT current generated by the example bandgap voltage generation circuit 105 at a PTAT current circuit node 225. Additionally, in at least some example implementations, the example CTAT current source 215 also accepts a substantially constant current generated by the bandgap voltage reference circuit 100 (such as a substantially constant current generated by the example high temperature correction circuit 115) at a constant current circuit node 230. The example CTAT current source 215 uses the PTAT-like current applied to the PTAT current circuit node 225, as well as the substantially constant current applied to the constant current circuit node 230 if available, to generate the CTAT current at the CTAT current circuit node 220. Example implementations of the CTAT current source 215 are illustrated in FIGS. 4 and 5 and discussed in greater detail below.

While an example manner of implementing the example bandgap voltage reference circuit 200 has been illustrated in FIG. 2, one or more of the circuit elements and/or devices illustrated in FIG. 2 may be combined, divided, re-arranged, omitted, eliminated and/or implemented in any other way. Further, the example prior art bandgap voltage reference circuit 100, the example bandgap voltage generation circuit 105, the example high temperature correction circuit 115, the example low temperature correction circuit 205, the example correction current generation circuit 210, the example CTAT current source 215 and/or, more generally, the example bandgap voltage reference circuit 200 of FIG. 2 could be implemented by one or more integrated circuit(s), application specific integrated circuit(s) (ASIC(s)), discrete circuit elements and/or other electronic devices, etc., similar to or different from the examples illustrated in FIG. 2. Further still, the example bandgap voltage reference circuit 200 of FIG. 2 may include one or more elements and/or devices in addition to, or instead of, those illustrated in FIG. 2, and/or may include more than one of any or all of the illustrated elements and devices.

Figure 3:
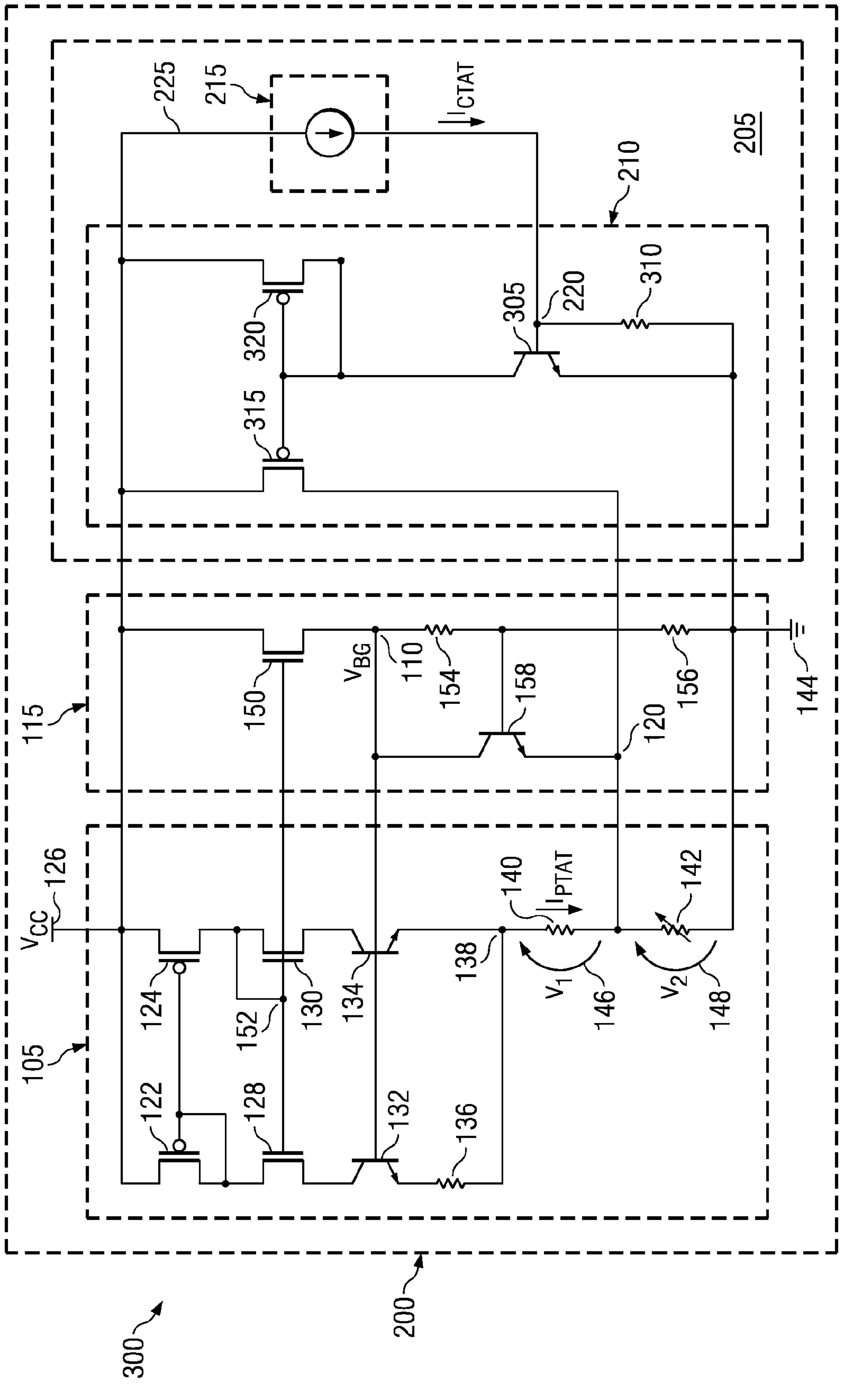
FIG. 3 is a schematic diagram illustrating an example conceptual implementation of the example bandgap voltage reference circuit of FIG. 2.

A schematic diagram of an example conceptual circuit implementation 300 of the example bandgap voltage reference circuit 200 of FIG. 2 is illustrated in FIG. 3. The example circuit implementation 300 of FIG. 3 includes elements in common with the example bandgap voltage reference circuits 100 and 200 of FIGS. 1 and 2, respectively. As such, like elements in FIGS. 1, 2 and 3 are labeled with the same reference numerals. The detailed descriptions of these like elements are provided above in connection with the discussion of FIGS. 1 and 2 and, in the interest of brevity, are not repeated in the discussion of FIG. 3.

Turning to FIG. 3, the example conceptual implementation 300 of the bandgap voltage reference circuit 200 depicts a more detailed implementation of the example correction current generation circuit 210. In the illustrated example of FIG. 3, the correction current generation circuit 210 includes a BJT 305 biased by a resistor 310, both of which are electrically coupled to the CTAT current circuit node 220. The example BJT 305 and the example resistor 310 are configured to generate a low temperature correction current from the CTAT current applied to the CTAT current circuit node 220 by the example CTAT current source 215.

For example, as shown in FIG. 3, the CTAT current applied to the CTAT current circuit node 220 will drive the example resistor 310 to produce a voltage potential across the base and the emitter of the example BJT 305. As described above, the CTAT current has a negative temperature coefficient. Thus, at low temperatures, the CTAT current will be larger and, thus, yield a correspondingly large voltage potential across the example resistor 310. This large voltage potential, in turn, will turn on the example BJT 305 at low temperatures and allow the BJT 305 to provide a current at its collector. Because the CTAT current applied to the example resistor 310 has a negative temperature coefficient and will decrease with increasing temperature, the voltage across the resistor 310 also decreases with increasing temperature. This decreasing voltage across the example 310 will cause a corresponding decrease in the current provided by the collector of the example BJT 305. This current will decrease until a temperature is reached at which the voltage across the example resistor 310 is insufficient to turn the example BJT 305 on. At this and higher temperatures, the example BJT 305 is off and does not provide current at its collector. As such, the current provided at the collector of the example BJT 305 is the low temperature correction current described above, which is produced only within a particular low temperature range and has a negative temperature coefficient. The particular temperature range below which the high temperature correction current is generated is determined by the value of the example resistor 310 and the characteristics of the CTAT current provided by the example CTAT source 215.

The example correction current generation circuit 210 of FIG. 3 also includes a pair of pMOSFETs 315 and 320 configured to implement a current mirror circuit. In the illustrated example, the sources of the example pMOSFETs 315 and 320 are both electrically coupled to the source Vcc voltage 126. Additionally, the gates of both example pMOSFETs 310 and 320 are electrically coupled together, with the gate and the drain of the example pMOSFET 320 also being electrically coupled together and to the collector of the example BJT 305. Such a configuration of the example pMOSFETs 310 and 320 causes a current provided at the drain of the example pMOSFET 320 to be mirrored at the drain of the example pMOSFET 315. Accordingly, as the current provided at the drain of the example pMOSFET 320 is the low temperature correction current provided at the collector of the example BJT 305, this low temperature correction current is mirrored to the drain of the example pMOSFET 320 and applied to the correction current input circuit node 120. The low temperature correction current applied to the correction current input circuit node 120 causes the voltage 148 across the example variable resistor 142 to increase only in the particular low temperature range when the low temperature correction current is available. Furthermore, this increase of the voltage 148 in the particular low temperature range has a negative temperature coefficient corresponding to the negative temperature coefficient of the low temperature correction current. In the illustrated example, such an increase in the voltage 148 is able to compensate for the PTAT current's inability to generate sufficient voltage across the example variable resistor 142 at low temperatures to provide second-order correction of the bandgap voltage reference generated at the output circuit node 110.

While an example circuit implementation 300 of the example bandgap voltage reference circuit 200 of FIG. 2 has been illustrated in FIG. 3, one or more of the circuit elements and/or devices illustrated in FIG. 3 may be combined, divided, re-arranged, omitted, eliminated and/or implemented in any other way. Further, the example bandgap voltage generation circuit 105, the example high temperature correction circuit 115, the example low temperature correction circuit 205, the example correction current generation circuit 210, the example CTAT current source 215, the example pMOSFETs 122, 124, 315, and/or 320, the example nMOSFETs 128 and/or 130, the example BJTs 132, 134, 158 and/or 305, the example resistors 136, 138, 140, 142, 154, 156 and/or 310, and/or, more generally, the example circuit implementation 300 of the example bandgap voltage reference circuit 200 of FIG. 3 could be implemented by one or more integrated circuit(s), application specific integrated circuit(s) (ASIC(s)), discrete circuit elements and/or other electronic devices, etc., similar to or different from the examples illustrated in FIG. 3. Further still, the example circuit implementation 300 of the example bandgap voltage reference circuit 200 of FIG. 3 may include one or more elements and/or devices in addition to, or instead of, those illustrated in FIG. 3, and/or may include more than one of any or all of the illustrated elements and devices.

A schematic diagram of a first detailed example circuit implementation 400 of the example bandgap voltage reference circuit 200 of FIG. 2 is illustrated in FIG. 4. The example circuit implementation 400 of FIG. 4 includes elements in common with the example bandgap voltage reference circuits 100, 200 and 300 of FIGS. 1, 2 and 3, respectively. As such, like elements in FIGS. 1, 2, 3 and 4 are labeled with the same reference numerals. The detailed descriptions of these like elements are provided above in connection with the discussion of FIGS. 1, 2 and 3 and, in the interest of brevity, are not repeated in the discussion of FIG. 4.

Turning to FIG. 4, the first detailed example implementation 400 of the bandgap voltage reference circuit 200 depicts an example implementation of the CTAT source 215. In the illustrated example of FIG. 4, the example CTAT current source 215 includes a pMOSFET 405 electrically coupled at the PTAT current circuit node 225 with the example pMOSFETs 122 and 124 of the example bandgap voltage generation circuit 105. Such a configuration causes the example pMOSFET 405 to act as a current mirror and output a current at its drain that is related to the PTAT current generated by the example bandgap voltage generation circuit 105.

In the illustrated example of FIG. 4, the PTAT-like current output by the example pMOSFET 405 is provided to an example circuit including a BJT 410, a BJT 415 and a resistor 420 to generate a CTAT current as follows. The example BJT 410, BJT 415 and resistor 420 implement a feedback configuration in which the example BJT 410 is used as a feedback transistor to set a voltage across the resistor 420 and, thus, across the base and emitter of the example BJT 415. The PTAT-like current output by the example pMOSFET 405 is configured to drive the collector of the example BJT 415. This feedback configuration causes the voltage across the example resistor 420 to be adjusted to be just sufficient enough for the example BJT 415 to supply the PTAT current. In the illustrated example, the internal $V_{BE}$ of the example BJT 415 has a negative temperature coefficient. Therefore, the voltage across the example resistor 420 will decrease with increasing temperature, thereby causing the current through the resistor 420 to also decrease with increasing temperature. As such, the current through the resistor 420 exhibits CTAT behavior. Furthermore, the current at the collector of the example BJT 410 will exhibit a corresponding CTAT behavior.

The example CTAT current source 215 of FIG. 4 also includes a pair of pMOSFETs 425 and 430 configured to implement a current mirror circuit. In the illustrated example, the sources of the example pMOSFETs 425 and 430 are both electrically coupled to the source Vcc voltage 126. Additionally, the gates of both example pMOSFETs 425 and 430 are electrically coupled together, with the gate and the drain of the example pMOSFET 430 also being electrically coupled together and to the collector of the example BJT 410. Such a configuration of the example pMOSFETs 425 and 430 causes a current provided at the drain of the example pMOSFET 430 to be mirrored at the drain of the example pMOSFET 425. Accordingly, as the current provided at the drain of the example pMOSFET 430 is the CTAT current provided at the collector of the example BJT 410, the CTAT current is mirrored to the drain of the example pMOSFET 320 and applied to the CTAT current circuit node 220 for use by the example correction current generation circuit 210 as described above.

Also, in the illustrated example, the ratio of the example resistor 310 to the example resistor 420 is configured to be less than one to ensure that the low-temperature correction current provided by the example BJT 305 occurs only at low temperatures.

While a first detailed example circuit implementation 400 of the example bandgap voltage reference circuit 200 of FIG. 2 has been illustrated in FIG. 4, one or more of the circuit elements and/or devices illustrated in FIG. 4 may be combined, divided, re-arranged, omitted, eliminated and/or implemented in any other way. Further, the example bandgap voltage generation circuit 105, the example high temperature correction circuit 115, the example low temperature correction circuit 205, the example correction current generation circuit 210, the example CTAT current source 215, the example pMOSFETs 122, 124, 315, 320, 405, 425 and/or 430, the example nMOSFETs 128 and/or 130, the example BJTs 132, 134, 158, 305, 410 and/or 415, the example resistors 136, 138, 140, 142, 154, 156, 310 and/or 420, and/or, more generally, the example circuit implementation 400 of the example bandgap voltage reference circuit 200 of FIG. 4 could be implemented by one or more integrated circuit(s), application specific integrated circuit(s) (ASIC(s)), discrete circuit elements and/or other electronic devices, etc., similar to or different from the examples illustrated in FIG. 4. Further still, the example circuit implementation 400 of the example bandgap voltage reference circuit 200 of FIG. 4 may include one or more elements and/or devices in addition to, or instead of, those illustrated in FIG. 4, and/or may include more than one of any or all of the illustrated elements and devices.

A schematic diagram of a second detailed example circuit implementation 500 of the example bandgap voltage reference circuit 200 of FIG. 2 is illustrated in FIG. 5. The example circuit implementation 500 of FIG. 5 includes elements in common with the example bandgap voltage reference circuits 100, 200 and 300 of FIGS. 1, 2 and 3, respectively. As such, like elements in FIGS. 1, 2, 3 and 5 are labeled with the same reference numerals. The detailed descriptions of these like elements are provided above in connection with the discussion of FIGS. 1, 2 and 3 and, in the interest of brevity, are not repeated in the discussion of FIG. 5.

Turning to FIG. 5, the second detailed example implementation 500 of the bandgap voltage reference circuit 200 depicts another example implementation of the CTAT source 215. As such, the examples of FIGS. 4 and 5 depict alternative implementations of the example CTAT source 215. In the illustrated example of FIG. 5, the example CTAT current source 215 includes a pMOSFET 505 electrically coupled at the PTAT current circuit node 225 with the example pMOSFETs 122 and 124 of the example bandgap voltage generation circuit 105. Such a configuration causes the example pMOSFET 505 to act as a current mirror and output a current at its drain that is related to the PTAT current generated by the example bandgap voltage generation circuit 105.

Additionally, the example CTAT current source 215 of FIG. 5 includes a pMOSFET 510 electrically coupled at the constant current circuit node 230 with a pMOSFET 515 that has been added to the example high temperature correction circuit 115 as shown. Such a configuration causes the example pMOSFET 510 to act as a current mirror and output a current at its drain corresponding to the current provided by the example pMOSFET 515. Because the bandgap voltage at the circuit output node 110 will be relatively constant over temperature, the current provided by the example pMOSFET 515 will also be relatively constant. As such, the current mirrored by the example pMOSFET 510 will be a relatively constant current over temperature.

To generate the CTAT current, the example CTAT current source 215 of FIG. 5 further includes a pair of nMOSFETs 520 and 525 configured to implement a current mirror circuit. In the illustrated example, the nMOSFETs 520 and 525 are configured to mirror the constant current provided by the example pMOSFET 510 to the circuit node 530 as shown. Additionally, the example pMOSFET 505 provides the PTAT-like current to the circuit node 530 as well. Because current is conserved at the circuit node 530, the circuit node 530 will operate to subtract the constant current from the PTAT-like current to yield a CTAT current at the source of an example pMOSFET 535.

The example CTAT current source 215 of FIG. 5 further includes the pMOSFET 535 and a pMOSFET540 configured to implement a current mirror circuit. In the illustrated example, the sources of the example pMOSFETs 535 and 540 are both electrically coupled to the source Vcc voltage 126. Additionally, the gates of both example pMOSFETs 535 and 540 are electrically coupled together, with the gate and the drain of the example pMOSFET 535 also being electrically coupled together and to the circuit node 530. Such a configuration of the example pMOSFETs 535 and 540 causes a current provided at the drain of the example pMOSFET 535 to be mirrored at the drain of the example pMOSFET 540. Accordingly, as the current provided at the drain of the example pMOSFET 535 is the CTAT current, the CTAT current is mirrored to the drain of the example pMOSFET 540 and applied to the CTAT current circuit node 220 for use as described above.

Also, in the illustrated example, the ratio 'x' of the size of the example pMOSFET 510 (specified, for example, as a width to length of xW/L) to the size of the example pMOSFET 515 (specified, for example, as a width to length of W/L) is a design parameter to set the CTAT current.

While a second detailed example circuit implementation 500 of the example bandgap voltage reference circuit 200 of FIG. 2 has been illustrated in FIG. 5, one or more of the circuit elements and/or devices illustrated in FIG. 5 may be combined, divided, re-arranged, omitted, eliminated and/or implemented in any other way. Further, the example bandgap voltage generation circuit 105, the example high temperature correction circuit 115, the example low temperature correction circuit 205, the example correction current generation circuit 210, the example CTAT current source 215, the example pMOSFETs 122, 124, 315, 320, 505, 510, 535 and/or 540, the example nMOSFETs 128, 130, 520 and/or 525, the example BJTs 132, 134, 158 and/or 305, the example resistors 136, 138, 140, 142, 154, 156 and/or 310, and/or, more generally, the example circuit implementation 500 of the example bandgap voltage reference circuit 200 of FIG. 5 could be implemented by one or more integrated circuit(s), application specific integrated circuit(s) (ASIC(s)), discrete circuit elements and/or other electronic devices, etc., similar to or different from the examples illustrated in FIG. 5. Further still, the example circuit implementation 500 of the example bandgap voltage reference circuit 200 of FIG. 5 may include one or more elements and/or devices in addition to, or instead of, those illustrated in FIG. 5, and/or may include more than one of any or all of the illustrated elements and devices.

Figure 6:
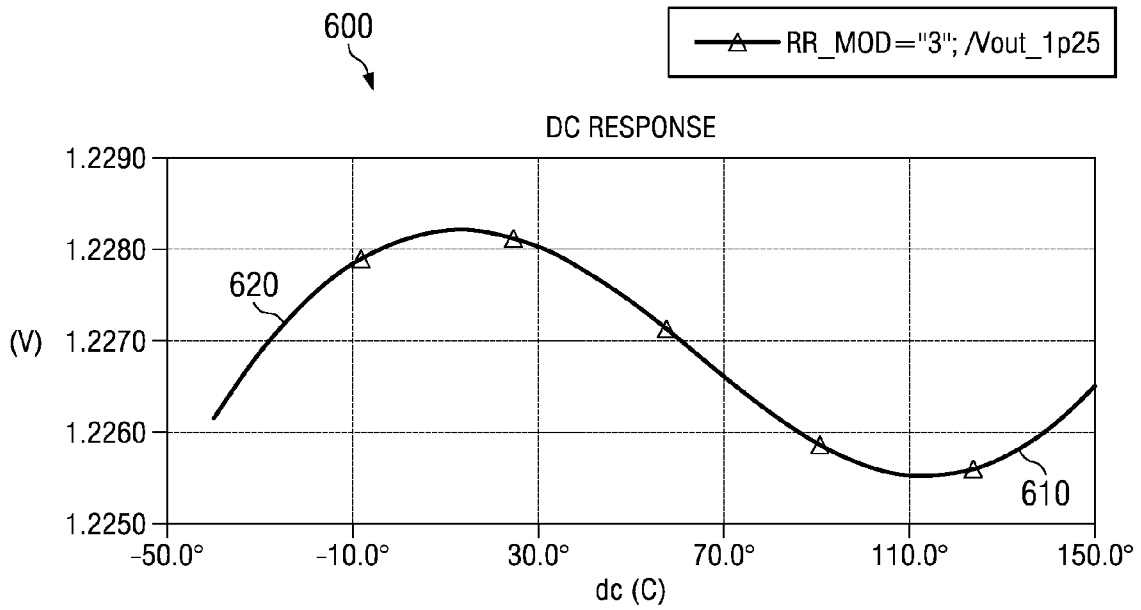
FIG. 6 is a graph illustrating an example output bandgap voltage characteristic relative to temperature for the example prior art bandgap voltage reference circuit of FIG. 1.
Figure 7:
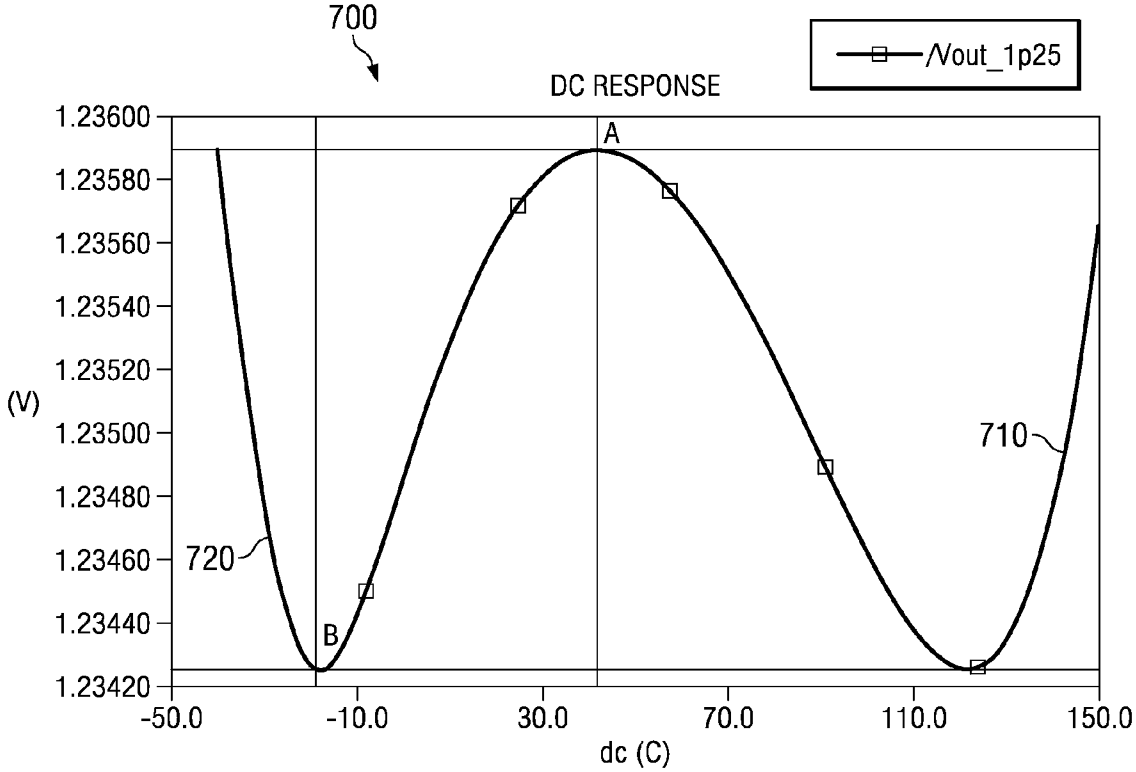
FIG. 7 is a graph illustrating an example output bandgap voltage characteristic relative to temperature for the example bandgap voltage reference circuits of FIGS. 2-4 and/or 5 for a nominal process corner implementation.
Figure 8:
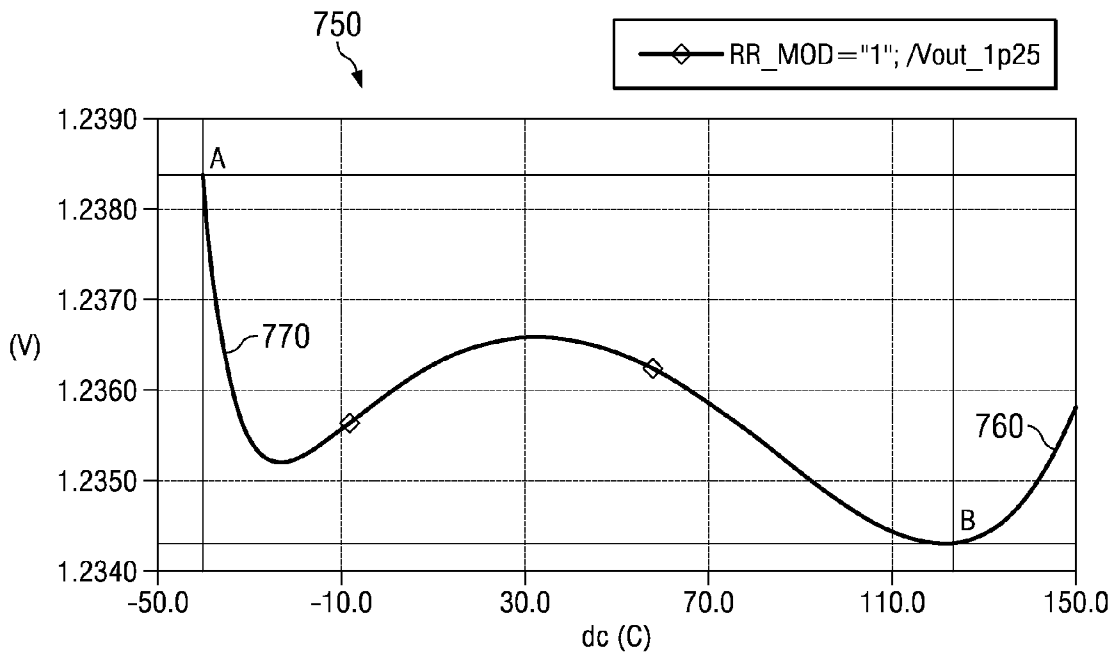
FIG. 8 is a graph illustrating an example output bandgap voltage characteristic relative to temperature for the example bandgap voltage reference circuits of FIGS. 2-4 and/or 5 for a strong process corner implementation.

Graphs depicting potential improvements associated with the example bandgap voltage reference circuit 200 of FIG. 2 supporting higher-order bandgap voltage correction according to the methods and apparatus described herein relative to the example prior art bandgap voltage reference circuit 100 of FIG. 1 are provided in FIGS. 6-8. In particular, FIG. 6 illustrates an example output bandgap voltage characteristic 600 relative to temperature for the example prior art bandgap voltage reference circuit 100 of FIG. 1. To generate the example output bandgap voltage characteristic 600, the example variable resistor 142 of the example prior art bandgap voltage reference circuit 100 was trimmed to yield a bandgap voltage reference at the circuit output node 110 of approximately 1.236 Volts (V) at 27° Celsius (C). However, the actual output bandgap voltage at 27° C. is not necessarily 1.236 V due to limited trimming resolution, circuit nonlinearities, etc.

As shown in FIG. 6, the example output bandgap voltage characteristic 600 varies between approximately 1.2255 V and 1.2282 V, yielding a 2.7 mV variation over the 200° C.

temperature range shown. Additionally, the example output bandgap voltage characteristic 600 illustrates the operation of the example high temperature correction circuit 115 included in the example prior art bandgap voltage reference circuit 100. For example, as temperature increases, the example output bandgap voltage characteristic 600 depicts that the output bandgap voltage will decrease. However, at a sufficiently high temperature, the example high temperature correction circuit 115 begins providing the high temperature correction current. The high temperature correction current causes the output bandgap voltage to increase with increasing temperature, as shown in the portion 610 of the example output bandgap voltage characteristic 600. This second-order correction at high temperature keeps the output bandgap voltage from continue to decrease as temperature increases, thereby reducing the variation in the output bandgap voltage.

Because the example prior art bandgap voltage reference circuit 100 does not included a low temperature correction circuit, the output bandgap voltage does not receive a corresponding second-order correction at low temperatures. As such, the output bandgap voltage will just continue to decrease with decreasing temperature, as shown in the portion 620 of the example output bandgap voltage characteristic 600.

FIG. 7 illustrates an example output bandgap voltage characteristic 700 relative to temperature for the example bandgap voltage reference circuit 200 of FIG. 2 supporting higher-order bandgap voltage correction according to the methods and apparatus described herein. The example output bandgap voltage characteristic 700 corresponds to a nominal process corner implementation. To generate the example output bandgap voltage characteristic 700, the example variable resistor 142 illustrated in the example implementation 300 of the example bandgap voltage reference circuit 200 was trimmed to yield a bandgap voltage reference at the circuit output node 110 of approximately 1.236 V at 27° C. However, the actual output bandgap voltage at 27° C. is not necessarily 1.236 V due to limited trimming resolution, circuit nonlinearities, etc.

As shown in FIG. 7, the example output bandgap voltage characteristic 700 varies between approximately 1.23423 V and 1.23585 V, yielding a 1.62 mV variation over the 200° C. temperature range shown. Thus, the output bandgap voltage variation exhibited by the example bandgap voltage reference circuit 200 is significantly less than the variation exhibited by the example prior-art bandgap voltage reference circuit 100.

Additionally, the example output bandgap voltage characteristic 700 also illustrates the operation of the example high temperature correction circuit 115 included in the example bandgap voltage reference circuit 200. For example, as temperature increases, the example output bandgap voltage characteristic 700 depicts that the output bandgap voltage will decrease. However, at a sufficiently high temperature, the example high temperature correction circuit 115 begins providing the high temperature correction current. The high temperature correction current causes the output bandgap voltage to increase with increasing temperature, as shown in the portion 710 of the example output bandgap voltage characteristic 700. This second-order correction at high temperature keeps the output bandgap voltage from continue to decrease as temperature increases, thereby reducing the variation in the output bandgap voltage.

Because the example bandgap voltage reference circuit 200 also includes a low temperature correction circuit 205, the output bandgap voltage receives a similar second-order correction at low temperatures. For example, as temperature decreases, the example output bandgap voltage characteristic 700 depicts that the output bandgap voltage will decrease. However, at a sufficiently low temperature, the example low temperature correction circuit 205 begins providing the low temperature correction current. The negative temperature coefficient of the low temperature correction current causes the output bandgap voltage to increase with decreasing temperature, as shown in the portion 720 of the example output bandgap voltage characteristic 700. This second-order correction at low temperature keeps the output bandgap voltage from continuing to decrease as temperature decreases, thereby reducing the variation in the output bandgap voltage.

In the illustrated example of FIG. 7, the example bandgap voltage reference circuit 200 is configured such that the particular low temperature region in which the low temperature correction current is generated is substantially nonoverlapping with the particular high temperature region in which the high temperature correction current is generated. As such, the example output bandgap voltage characteristic 700 exhibits a somewhat symmetric characteristic with substantially similar second-order bandgap voltage correction occurring in both the low temperature portion 720 and high temperature portion 710 of the example output bandgap voltage characteristic 700. Due to this symmetric-like voltage characteristic, trimming of the example bandgap voltage reference circuit 200 at only one nominal temperature (such as 27° C.) is needed, potentially simplifying bandgap voltage reference calibration.

FIG. 8 illustrates another example output bandgap voltage characteristic 750 relative to temperature for the example bandgap voltage reference circuit 200 of FIG. 2 supporting higher-order bandgap voltage correction according to the methods and apparatus described herein. The example output bandgap voltage characteristic 750 corresponds to a strong process corner implementation with trimming as performed to generate the example output bandgap voltage characteristic 700 of FIG. 7. Similar to the FIG. 7, in the example of FIG. 8 a high temperature correction current causes the output bandgap voltage to increase with increasing temperature, as shown in the portion 760 of the example output bandgap voltage characteristic 750. Furthermore, the low temperature correction current causes the output bandgap voltage to increase with decreasing temperature, as shown in the portion 770 of the example output bandgap voltage characteristic 750.

Figure 9:
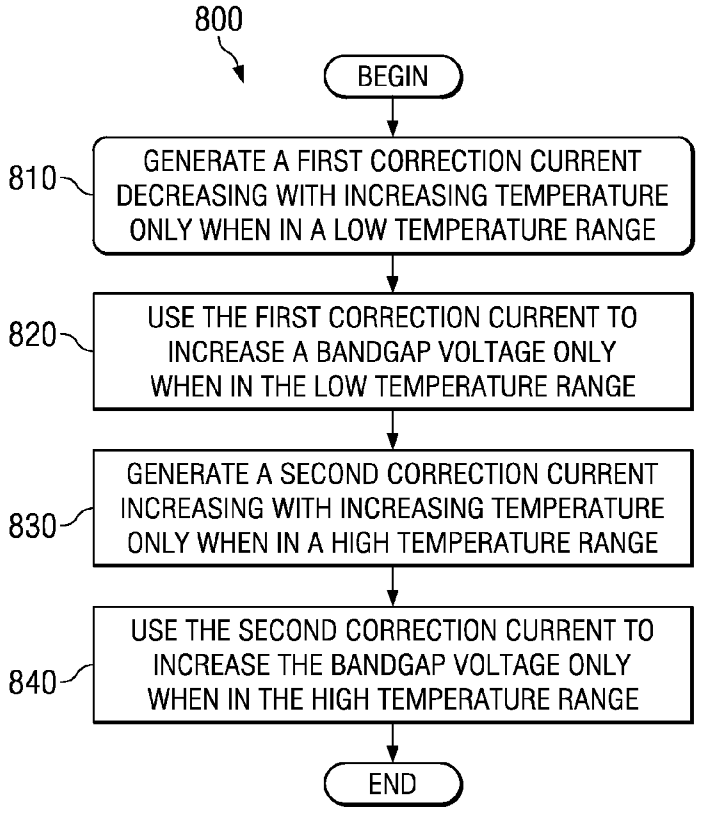
FIG. 9 is a flowchart representative of an example bandgap voltage correction process that may be performed by the example bandgap voltage reference circuits of FIGS. 2-4 and/or 5.
Figure 10:
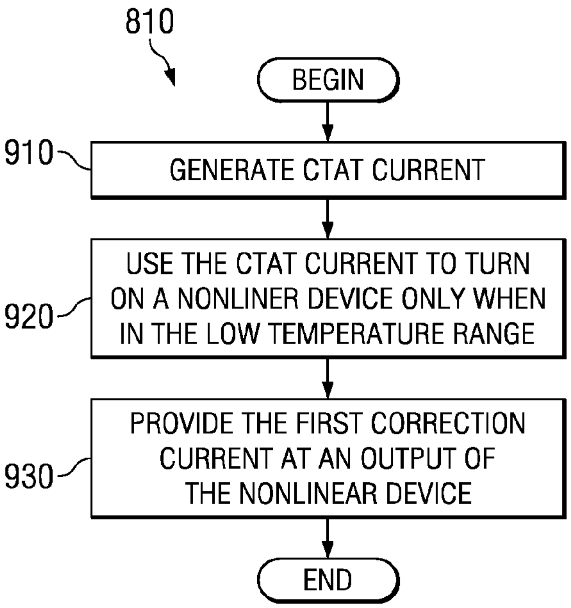
FIG. 10 is a flowchart representative of an example correction current generation process that may be performed by the example bandgap voltage reference circuits of FIGS. 2-4 and/or 5 to implement the example bandgap voltage correction process of FIG. 9.
Figure 11:
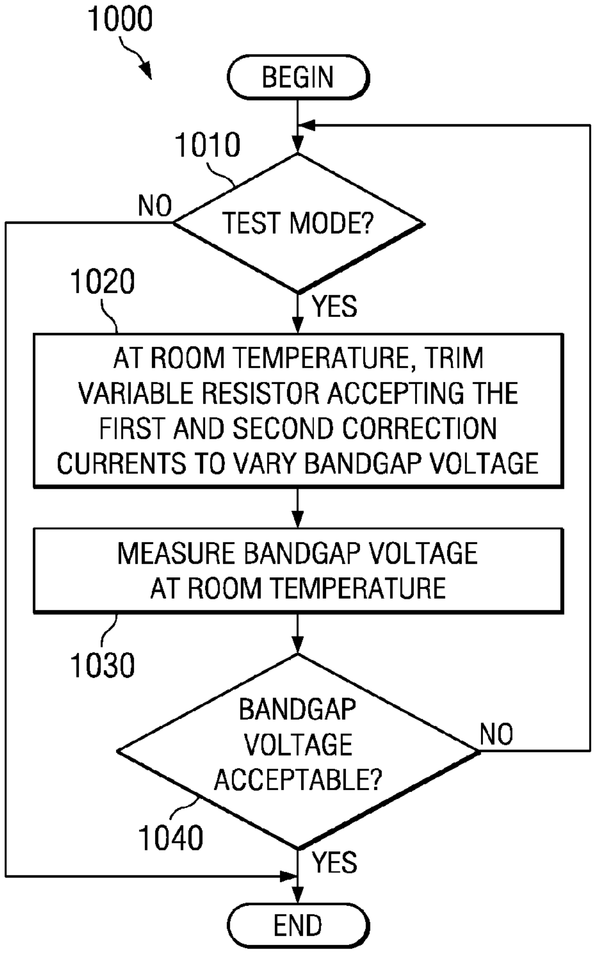
FIG. 11 is a flowchart representative of an example bandgap voltage trimming process that may be performed to trim the bandgap voltage reference provided by the example bandgap voltage reference circuits of FIGS. 2-4 and/or 5.

Flowcharts representative of example processes that may be implemented by all, or at least portions of, the example bandgap voltage reference circuit 200, the example circuit implementations 300, 400 and/or 500 of the example bandgap voltage reference circuit 200, the example bandgap voltage generation circuit 105, the example high temperature correction circuit 115, the example low temperature correction circuit 205, the example correction current generation circuit 210 and/or the example CTAT current source 215 are shown in FIGS. 9-11. Additionally or alternatively, any, all or portions thereof of the example bandgap voltage reference circuit 200, the example circuit implementations 300, 400 and/or 500 of the example bandgap voltage reference circuit 200, the example bandgap voltage generation circuit 105, the example high temperature correction circuit 115, the example low temperature correction circuit 205, the example correction current generation circuit 210, the example CTAT current source 215, and/or the example processes represented by the flowcharts of FIGS. 9-10 and/or 11 could be implemented by any combination of software, firmware, hardware devices and/or combinational logic, other circuitry, etc., configured to implement functionality similar to the hardware circuitry shown in FIGS. 2-5. Also, some or all of the processes represented by the flowcharts of FIGS. 9-11 may be implemented manually. Further, although the example processes are described with reference to the flowcharts illustrated in FIGS. 9-11, many other techniques for implementing the example methods and apparatus described herein may alternatively be used. For example, with reference to the flowcharts illustrated in FIGS. 9-11, the order of execution of the blocks may be changed, and/or some of the blocks described may be changed, eliminated, combined and/or subdivided into multiple blocks.

An example bandgap voltage correction process 800 that may be implemented by the example bandgap voltage reference circuit 200 of FIG. 2 and/or the example circuit implementations 300, 400 and/or 500 of the example bandgap voltage reference circuit 200 shown in FIGS. 3, 4 and 5, respectively, is illustrated in FIG. 9. The example bandgap voltage correction process 800 operates to perform second-order correction of the bandgap voltage output by the example bandgap voltage reference circuit 200. Referring also to FIGS. 2 and 3, the example bandgap voltage correction process of FIG. 9 begins at block 810 at which the example low temperature correction circuit 205 generates a first, low temperature correction current only within a particular low temperature range. At block 810, the low temperature current generated by the example low temperature correction circuit 205 exhibits a negative temperature coefficient and, thus, decreases with increasing temperature (or, equivalently, increases with decreasing temperature) within the particular low temperature range. An example correction current generation process that may be used to implement the processing at block 810 is illustrated in FIG. 10 and discussed in greater detail below.

Control next proceeds to block 820 at which the example bandgap voltage reference circuit 200 uses the first, low temperature correction current generated at block 810 to perform second-order correction of its output bandgap voltage reference within the particular low temperature range. As described above, in the example circuit implementation 300 of the example voltage reference circuit 200, the bandgap voltage reference at the output circuit node 110 is generated by the first and second voltages 146 and 148 across the resistors 142 and 146, respectively, combined with the $V_{BE}$ of the BJT 134. In the illustrated example, the PTAT current generated over substantially the entire operating range of the example bandgap voltage reference circuit 200 is able to provide sufficient first and second voltages 146 and 148 across the resistors 142 and 146, respectively, to yield a substantially constant output bandgap voltage at least within a nominal (middle) operating temperature range. However, at low and high temperatures, additional correction current at the variable resistor 146 can help maintain the output bandgap voltage substantially constant as the PTAT current diminishes at low temperatures and the $V_{BE}$ of the BJT 134 diminishes at high temperatures. Thus, at block 820 the example low temperature correction circuit 205 mirrors the low temperature correction current generated at block 810 to the correction current input circuit node 120 to further increase the voltage 148 across the example variable resistor 142 that contributes to the output bandgap voltage reference. This voltage increase occurs only within the low temperature range, which is generally a subset of the temperature range over which the PTAT current is generated and used to provide the associated voltage 148 across the example variable resistor 142.

Next, control proceeds to block 830 at which the example high temperature correction circuit 115 generates a second, high temperature correction current only within a particular high temperature range. At block 830, the high temperature current generated by the example high temperature correction circuit 115 exhibits a positive temperature coefficient and, thus, increases with increasing temperature (or, equivalently, decreases with decreasing temperature) within the particular high temperature range. Generation of the high temperature correction current by the example high temperature correction circuit 115 is described above in connection with FIG. 1.

Control then proceeds to block 840 at which the example bandgap voltage reference circuit 200 uses the second, high temperature correction current generated at block 830 to perform second-order correction of its output bandgap voltage reference only within the particular high temperature range. For example, at block 840 the example high temperature correction circuit 115 applies the high temperature correction current generated at block 830 to the correction current input circuit node 120 to further increase the voltage 148 across the example variable resistor 142 that contributes to the output bandgap voltage reference. This voltage increase occurs only within the high temperature range, which is generally a subset of the temperature range over which the PTAT current is generated and used to provide the associated voltage 148 across the example variable resistor 142. Execution of the example bandgap voltage correction process 800 ends.

A flowchart representative of an example low temperature correction current generation process 810 that may be used to implement the processing at block 810 of FIG. 9 is illustrated in FIG. 10. Referring also to FIGS. 2 and 3, execution of the example process 810 of FIG. 9 begins at block 910 at which the example CTAT current source 215 included in the example low temperature correction circuit 205 generates a CTAT current over substantially all of the circuit's operating temperature range. In the illustrated example, the CTAT current generated at block 910 has a negative temperature coefficient and, thus, decreases with increasing temperature (or, equivalently, increases with decreasing temperature).

Next, control proceeds to block 920 at which the example correction current generation circuit 210 included in the example low temperature correction circuit 205 uses the CTAT current generated at block 910 to turn on a nonlinear device only when in a particular low temperature range. For example, at block 920 the CTAT current generated at block 910 is used to generate a voltage across the example resistor 310 to bias the example BJT 305 (a type of nonlinear device) and turn the example BJT 305 on only within the particular low temperature range.

Control then proceeds to block 930 at which the example correction current generation circuit 210 included in the example low temperature correction circuit 205 provides the first, low temperature correction current at the output of the nonlinear device. In the example described above in connection with block 920, because the CTAT current used to bias the example BJT 305 has a negative temperature coefficient, the resulting current output by the BJT 305 will also have a negative temperature coefficient and will be generated only in the particular low temperature range. As such, the current output by the example BJT 305 is the example low temperature correction current output at block 930. After processing at block 930 completes, execution of the example process 810 of FIG. 9 ends.

A flowchart representative of an example bandgap voltage trimming process 1000 that may be performed to trim the bandgap voltage output by the example bandgap voltage reference circuit 200 of FIG. 2 and/or the example circuit implementations 300, 400 and/or 500 of the example bandgap voltage reference circuit 200 shown in FIGS. 3, 4 and 5, respectively, is illustrated in FIG. 11. Referring also to FIGS. 2 and 3, execution of the example process 1000 of FIG. 11 begins at block 1010 at which a determination is made regarding whether the bandgap voltage reference circuit 200 is operating in a test mode or a normal mode. For example, such a determination may be made by a test engineer performing calibration of the example bandgap voltage reference circuit 200, by evaluating a test mode circuit input (not shown), or implicitly by simply performing the trimming process 1000. If the bandgap voltage reference circuit 200 is not operating in a test mode (block 1010), execution of the example process 1000 ends. However, if the bandgap voltage reference circuit 200 is operating in a test mode (block 1010), control proceeds to block 1020.

At block 1020, the example variable resistor 142 is trimmed (or, in other words, adjusted) to vary the bandgap voltage reference provided at the output circuit node 110. As discussed above, because the low temperature correction current provided by the example low temperature correction circuit 205 and the high temperature correction current provided by the example high temperature correction circuit 115 are both applied to this same variable resistor 142, trimming of the bandgap voltage reference can be performed by the single variable resistor 142. This feature of the example bandgap voltage reference circuit 200 can simplify and, thus, potentially reduce the cost associated with bandgap voltage reference calibration. Additionally, as illustrated in the example output bandgap voltage characteristic 700 of FIG. 7, the low temperature and the high temperature correction currents are designed to provide additional bandgap voltage correction at low and high temperatures, respectively (as depicted by the portions 710 and 720 of the example output bandgap voltage characteristic 700). Thus, trimming can be performed at only a single nominal temperature, such as room temperature, with the low temperature and the high temperature correction currents being relied upon to maintain the trimmed bandgap voltage reference at lower and higher temperatures. Stated another way, even though additional, higher-order correction is applied at lower and higher temperatures, trimming at only room temperature is sufficient. As such, trimming of the example bandgap voltage reference circuit 200 at multiple temperatures is unnecessary.

Next, control proceeds to block 1030 at which the bandgap voltage reference provided at the output circuit node 110 is measured. In the illustrated example, such measurement needs to be performed for only the single nominal temperature, such as room temperature, at which the trimming at block 1020 is performed. Control then proceeds to block 1040 at which a determination is made regarding whether the measured bandgap voltage is acceptable. If the measured bandgap voltage is not acceptable (block 1010), control returns to block 1010 and blocks subsequent thereto at which bandgap voltage trimming continues. However, if the measured bandgap voltage is acceptable (block 1010), execution of the example process 1000 of FIG. 11 ends.

As an alternative to implementing the methods and/or apparatus described herein using hardware circuitry and/or devices such as those shown in FIGS. 2-5, the methods and or apparatus described herein may be embedded in a structure such as a processor and/or an ASIC (application specific integrated circuit).

Finally, although certain example apparatus, methods, and articles of manufacture are described herein, other implementations are possible. The scope of coverage of this patent is not limited to the specific examples described herein. On the contrary, this patent covers all apparatus, methods, and articles of manufacture falling within the scope of the invention.

What is claimed is:

1. A bandgap voltage reference circuit comprising:

a bandgap voltage generation circuit comprising a first resistor, the bandgap voltage generation circuit configured to generate a proportional-to-absolute-temperature (PTAT) current to drive the first resistor to produce a first voltage, the first voltage contributing to an output bandgap voltage; and a first correction circuit electrically coupled to the first resistor and configured to provide a first correction current, the first correction circuit comprising a first nonlinear device configured to generate the first correction current only within a first temperature range, the first correction current decreasing with increasing temperature, the first correction current to drive the first resistor to increase the first voltage only within the first temperature range.

2. A bandgap voltage reference circuit as defined in claim 1 wherein the bandgap voltage generation circuit comprises:

a first cascoded transistor circuit configured to provide current and voltage mirroring; and a second transistor circuit electrically coupled to the first cascoded transistor circuit and configured to generate the PTAT current, the second transistor circuit further electrically coupled to the first resistor.

3. A bandgap voltage reference circuit as defined in claim 2 wherein the second transistor circuit is electrically coupled to the first resistor via a second resistor, and wherein the output bandgap voltage is substantially equal to a combination of the first voltage, a second voltage across the second resistor and a base-emitter voltage of a first transistor in the second transistor circuit, the base-emitter voltage having a decreasing voltage characteristic relative to increasing temperature.

4. A bandgap voltage reference circuit as defined in claim 1 wherein the first correction circuit comprises a current mirror circuit configured to electrically couple the first nonlinear device and the first resistor.

5. A bandgap voltage reference circuit as defined in claim 1 wherein the first nonlinear device comprises a transistor, and the first correction circuit further comprises:

a second resistor electrically coupled to a base of the transistor; and a complementary-to-absolute-temperature (CTAT) current source electrically coupled to the second resistor and the base of the transistor, the CTAT current source configured to drive the second resistor to bias the transistor, the second resistor sized to produce a temperature dependent voltage at the base of the transistor that decreases with increasing temperature and causes the transistor to turn on and provide the first correction current only within the first temperature range.

6. A bandgap voltage reference circuit as defined in claim 5 wherein the CTAT source comprises:

a first current mirror circuit electrically coupled to the bandgap voltage generation circuit and configured to mirror a current related to the PTAT current;

a transistor circuit electrically coupled to the first current mirror circuit and comprising a plurality of transistors electrically coupled in a feedback configuration to generate the CTAT current; and a second mirror circuit configured to electrically couple the transistor circuit with the second resistor and the base of the transistor.

7. A bandgap voltage reference circuit as defined in claim 5 wherein the CTAT source comprises:

a first current mirror circuit electrically coupled to the bandgap voltage generation circuit and configured to mirror a current related to the PTAT current;

a second current mirror circuit electrically coupled to the bandgap voltage generation circuit and configured to mirror a substantially constant current associated with the output bandgap voltage;

a transistor circuit electrically coupled to the first and second current mirror circuits and configured to subtract the current related to the PTAT current from the substantially constant current to generate the CTAT current; and a third mirror circuit configured to electrically couple the transistor circuit with the second resistor and the base of the transistor.

8. A bandgap voltage reference circuit as defined in claim 1 wherein the first resistor comprises a variable resistor that is adjustable to trim the output bandgap voltage.

9. A bandgap voltage reference circuit as defined in claim 1 further comprising a second correction circuit electrically coupled to the first resistor and configured to provide a second correction current, the second correction circuit comprising a second nonlinear device configured to generate the second correction current only within a second temperature range, the second correction current to increase with increasing temperature, the second correction current to drive the first resistor to increase the first voltage only within the second temperature range, the second temperature range higher than the first temperature range.

10. A bandgap voltage reference circuit as defined 9 wherein the first and second temperature ranges are substantially nonoverlapping.

11. A bandgap voltage reference circuit as defined 9 wherein the second nonlinear device comprises a transistor having an emitter configured to be electrically coupled to the first resistor, and wherein the second correction circuit further comprises a second resistor electrically coupled to a base of the transistor and configured to bias the transistor with a substantially constant voltage, the second resistor sized to keep the transistor turned off at temperatures below the second temperature range, the transistor having a temperature-dependent base-emitter voltage characteristic that causes the transistor to turn on and provide the second correction current only within the second temperature range.

12. A method to correct a bandgap voltage reference circuit, the method comprising:

generating a first correction current only within a first temperature range, the first correction current decreasing with increasing temperature; and applying the first correction current to a first resistor included in the bandgap voltage reference circuit to increase a first voltage across the first resistor only within the first temperature range, the first voltage contributing to a bandgap voltage output by the bandgap voltage reference circuit, the first voltage also produced by a proportional-to-absolute-temperature (PTAT) current applied to the first resistor, the PTAT current generated over a second operating temperature range of the bandgap voltage reference circuit larger than and including the first temperature range.

13. A method as defined in claim 12 wherein applying the first correction current to a first resistor comprises applying the first correction current to a current mirror circuit electrically coupled to the first resistor.

14. A method as defined in claim 12 wherein generating the first correction current comprises:

generating a complementary-to-absolute-temperature (CTAT) current; and using the generated CTAT current to produce a temperature dependent bias voltage to cause a transistor to turn on and provide the first correction current only within the first temperature range.

15. A method as defined in claim 12 wherein the first resistor comprises a variable resistor and further comprising trimming the bandgap voltage output by the bandgap voltage reference circuit by adjusting the variable resistor at only one operating temperature.

16. A method as defined in claim 12 further comprising:

generating a second correction current only within a third temperature range higher than the first temperature range, the second correction current increasing with increasing temperature; and applying the second correction current to the first resistor included in the bandgap voltage reference circuit to increase the first voltage across the first resistor only within the third temperature range, wherein the second operating temperature range over which the PTAT current is generated includes the first temperature range and the third temperature range.

17. A correction circuit for use in a bandgap voltage reference circuit, the correction circuit comprising:

a first transistor;

a first resistor electrically coupled to a base of the first transistor;

a complementary-to-absolute-temperature (CTAT) current source electrically coupled to the first resistor and the base of the first transistor, the CTAT current source configured to drive the first resistor, the first resistor sized to produce a temperature dependent bias voltage at the base of the first transmitter that decreases with increasing temperature and causes the first transistor to turn on and provide a first correction current at a collector of the first transistor only within a first temperature range, the first correction current decreasing with increasing temperature; and a first current mirror circuit configured to electrically couple the first correction current provided at the output of the collector of the first transistor to a second resistor included in the bandgap voltage reference circuit, the first correction current to drive the second resistor to increase a voltage across the second resistor only within the first temperature range, the voltage across the second resistor contributing to a bandgap voltage output by the bandgap voltage reference circuit, the voltage across the second resistor also produced by a proportional-to-absolute-temperature (PTAT) current applied to the second resistor, the PTAT current generated over a second operating temperature range of the bandgap voltage reference circuit larger than and including the first temperature range.

18. A correction circuit as defined in claim 17 wherein the CTAT source comprises:

a transistor circuit comprising a plurality of transistors electrically coupled in a feedback configuration to generate the CTAT current;

a second current mirror circuit electrically coupled to the transistor circuit and configured to mirror a current related to the PTAT current to drive the transistor circuit; and a third mirror circuit configured to electrically couple the transistor circuit with the first resistor and the base of the first transistor.

19. A correction circuit as defined in claim 17 wherein the CTAT source comprises:

a first current mirror circuit electrically coupled to a first circuit node of the bandgap voltage generation circuit and configured to mirror a current related to the PTAT current;

a second current mirror circuit electrically coupled to a second circuit node bandgap voltage generation circuit and configured to mirror a substantially constant current associated with the output bandgap voltage;

a transistor circuit electrically coupled to the first and second current mirror circuits and configured to subtract the current related to the PTAT current from the substantially constant current to generate the CTAT current; and a third mirror circuit configured to electrically couple the transistor circuit with the first resistor and the base of the first transistor.

20. A correction circuit as defined in claim 17 further comprising a second transistor electrically coupled to the second resistor to provide a second correction current, the second transistor configured to generate the second correction current only within a second temperature range, the second correction current increasing with increasing temperature, the second correction current to drive the second resistor to increase the voltage across the second resistor only within the second temperature range, the second temperature range higher than the first temperature range.

* * * * *